United States Patent
Brennan et al.

(10) Patent No.: US 7,506,276 B2
(45) Date of Patent: Mar. 17, 2009

(54) METHOD FOR ISOLATING PROBLEM NETWORKS WITHIN AN INTEGRATED CIRCUIT DESIGN

(75) Inventors: Thomas Charles Brennan, Rochester, MN (US); Todd Alan Greenfield, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 676 days.

(21) Appl. No.: 11/138,835

(22) Filed: May 26, 2005

(65) Prior Publication Data

US 2006/0271893 A1 Nov. 30, 2006

(51) Int. Cl.
*G06F 17/50* (2006.01)
(52) U.S. Cl. .............................................. 716/1; 716/6
(58) Field of Classification Search ...................... 716/6, 716/1; 703/13, 191; 702/117
See application file for complete search history.

(56) References Cited

U.S. PATENT DOCUMENTS

| | | | | |
|---|---|---|---|---|
| 6,058,256 A * | 5/2000 | Mellen et al. | ................. | 716/12 |
| 6,117,182 A * | 9/2000 | Alpert et al. | .................... | 716/8 |
| 6,405,350 B1 * | 6/2002 | Tawada | .......................... | 716/5 |
| 6,539,527 B2 * | 3/2003 | Naffziger et al. | ............... | 716/5 |
| 6,601,222 B1 * | 7/2003 | Mehrotra et al. | ............... | 716/5 |
| 6,675,118 B2 * | 1/2004 | Wanek et al. | ................ | 702/117 |
| 6,832,180 B1 * | 12/2004 | Sutera et al. | ................... | 703/13 |
| 2002/0147553 A1* | 10/2002 | Shimazaki et al. | ............ | 702/65 |
| 2002/0193959 A1* | 12/2002 | Wanek et al. | ............... | 702/117 |
| 2005/0060675 A1* | 3/2005 | Tetelbaum | ..................... | 716/5 |
| 2006/0047484 A1* | 3/2006 | Seroussi et al. | ............. | 702/191 |

* cited by examiner

*Primary Examiner*—Jack Chiang
*Assistant Examiner*—Suchin Parihar
(74) *Attorney, Agent, or Firm*—Dillon & Yudell LLP

(57) ABSTRACT

A method of modifying an integrated circuit design. A noise threshold is determined. A threshold, noisy wire length for a particular integrated circuit design is selected. An integrated circuit design is examined for problem networks or wires and all branches that cumulatively equal or exceed the designated threshold noisy wire length. Once the problem networks are identified, the driver circuits driving the problem networks are temporarily replaced with driver circuits with lesser driving capacity. The integrated circuit design is then tested and any new timing failures are identified. Networks that include new timing failures are isolated with symmetric and/or asymmetric wire configurations. This method of modifying an integrated circuit design is non-intrusive to existing neighboring wires, and thus the timing in existing wires is preserved.

12 Claims, 4 Drawing Sheets

METHOD FOR ISOLATING PROBLEM NETWORKS WITHIN AN INTEGRATED CIRCUIT DESIGN

BACKGROUND OF THE INVENTION

1. Technical Field

The present invention relates generally to integrated circuits and specifically to designing integrated circuits. Still more specifically, the present invention relates to an improved method of modifying existing integrated circuit designs.

2. Description of the Related Art

Over the last few decades, the electronics industry has faced rapid growth due to the increased demand for high performance computing, telecommunications, and consumer electronics. This increase in demand primarily stems from information services that provide high bandwidth media, such as streaming audio and video.

To meet these increased demands, each generation of integrated circuits faces a shorter design cycle. Frequently, it is more economical to redesign an existing integrated circuit design to meet the requirements of a product or service.

However, modifying integrated circuit designs presents designers with a new problem. During a redesign, integrated circuit designers frequently add new circuit elements and interconnects, which may crowd the existing design. This crowding of circuit elements and interconnects introduces crosstalk noise problems into the integrated circuit design.

Crosstalk noise is typically caused by capacitive coupling of neighboring wires. For example, two signals A (aggressor) and V (victim) are driven within two neighboring wires that are each driven by respective drivers. When signal A transitions, capacitive coupling induces noise into signal V. If signal V is a steady state signal, the noise takes the form of a spike in the signal and is smoothed out by V's driver circuit after some delay. However, if signal V transitions at the same time as A's transition, the induced crosstalk noise leads to a shorter or longer transition delay, depending on the configuration of the coupled wires. Therefore, increased crosstalk noise contributes to timing failures due to the changes to the transition delay. Several factors contribute to crosstalk, such as: the shape of wires, the distance between the wires, the number of metal layers in the integrated circuit design, and the impedance of the wires that contain signals A and V.

Once new circuit elements or interconnects are introduced into the design, the specific causes of crosstalk noise may be difficult to identify. Therefore, there is a need for a method of identifying problem areas within an integrated circuit design that are susceptible to crosstalk noise.

SUMMARY OF THE INVENTION

A method of modifying an integrated circuit design is disclosed. A noise threshold is determined. A threshold noisy wire length for a particular integrated circuit design is selected. An integrated circuit design is examined for problem networks or wires and all branches that cumulatively equal or exceed the designated threshold noisy wire length. Once the problem networks are identified, the driver circuits driving the problem networks are temporarily replaced with driver circuits with lesser driving capacity. The integrated circuit design is then tested and any new timing failures are identified. Networks that include new timing failures are isolated with symmetric and/or asymmetric wire configurations. This method of modifying an integrated circuit design is non-intrusive to existing neighboring wires, and thus the timing in existing wires is preserved.

BRIEF DESCRIPTION OF THE FIGURES

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF A PREFERRED EMBODIMENT

Figure 1:
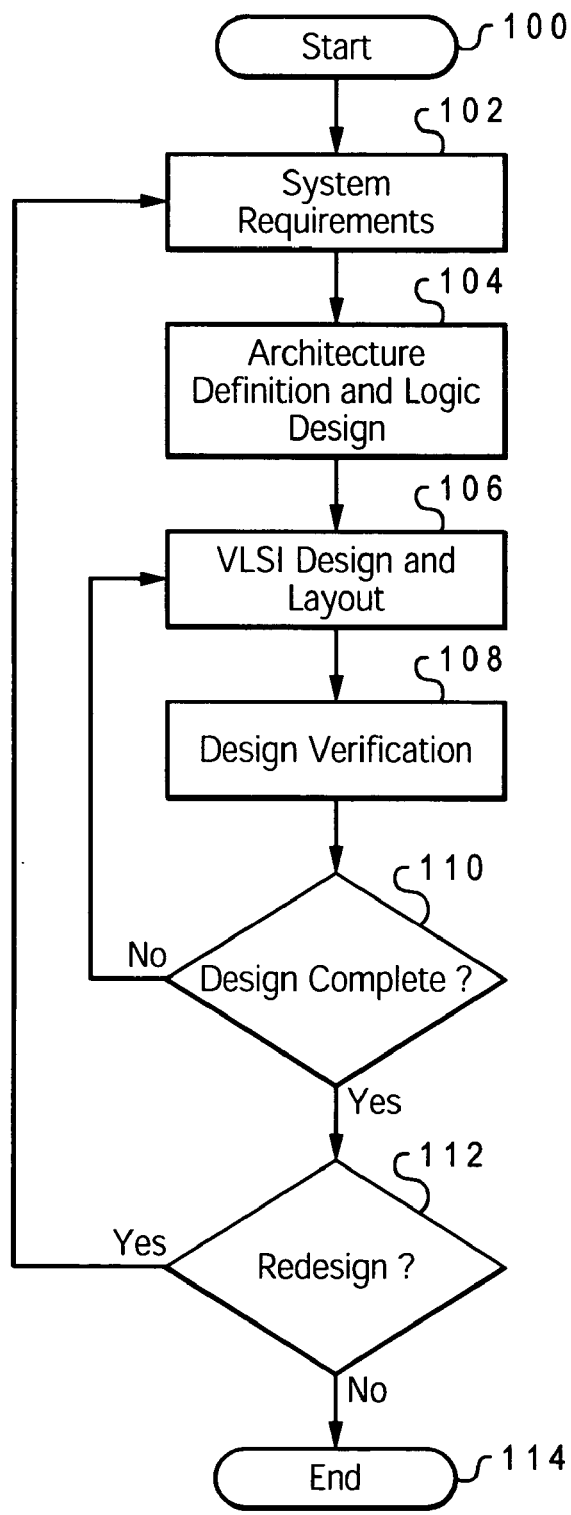
FIG. 1 is a high level flowchart diagram depicting an integrated circuit development and redesign flow in which a preferred embodiment of the present invention may be implemented.

Circuit Design Flow:

Due to the increased demands on the integrated circuit industry, the design cycle time has been reduced to a point where it is no longer feasible to require integrated circuit designers to introduce a completely new design for each new product or service. Therefore, instead of creating totally new integrated circuit designs, integrated circuit designers will modify existing integrated circuit designs. FIG. 1 is a high-level logical flowchart depicting a design flow of an integrated circuit in which a preferred embodiment of the present invention may be implemented.

The process begins at step 100 and proceeds to step 102, which illustrates circuit designers defining a set of system requirements for the design. Examples of system requirements include the clock speed and memory requirements of the integrated circuit design. Then, the process continues to step 104, which depicts circuit designers specifying the system requirements in an architectural definition and utilizing logic design techniques to describe the operation of the proposed circuit.

The process then continues to step 106, which depicts circuit designers laying out the circuit design utilizing a layout tool such as CADENCE™, which is a product of Cadence Design Systems of San Jose, Calif. The process proceeds to step 108, which illustrates a test engineer utilizing design verification tools. An example of a design verification tool is PSPICE™, also a product of Cadence Design Systems, which is a software program utilized to test a circuit design. The process continues to step 110, which illustrates a design or test engineer analyzing the results obtained from the design verification step to determine if the design process is complete. Typically, a design process may be considered complete if the system requirements articulated in step 102 have been met the design verification step 108.

If a circuit designer determines that the verification results do not meet the system requirements, the process returns to step 106 and proceeds in an iterative fashion. If, however, a circuit designer determines that the verification results do meet the system requirements, the process continues to step 112, which illustrates a circuit design determining whether or not the design requires a redesign. As discussed previously, circuit designers often modifying existing circuit designs to meet new specifications required by new products or services instead of designing new circuits due to time and price constraints. If the circuit requires a redesign or a new circuit, the process returns to step 102 and proceeds in an iterative fashion. If the circuit does not require a redesign, the process continues to step 114, which illustrates the process ending.

As previously discussed, one of the factors that contribute to crosstalk noise is the distance between two circuit elements, such as interconnects. Hereinafter, the terms "interconnect", "wire", and "networks" are utilized interchangeably. Once problem networks, or wires and all branches that cumulatively equal or exceed a predetermined threshold noisy wire length (WLEN) are identified (disclosed in more detail in conjunction with FIG. 4), the method disclosed by the present invention utilizes two wire configurations to isolate the identified problem networks from any circuit elements or interconnects that are added during the redesign process. These wire configurations are a "symmetrically-isolated wire configuration" and an "asymmetrically-isolated wire configuration". This method of modifying an integrated circuit design is non-intrusive to existing neighboring wires, and thus the timing in existing wires is preserved.

Figure 2A:
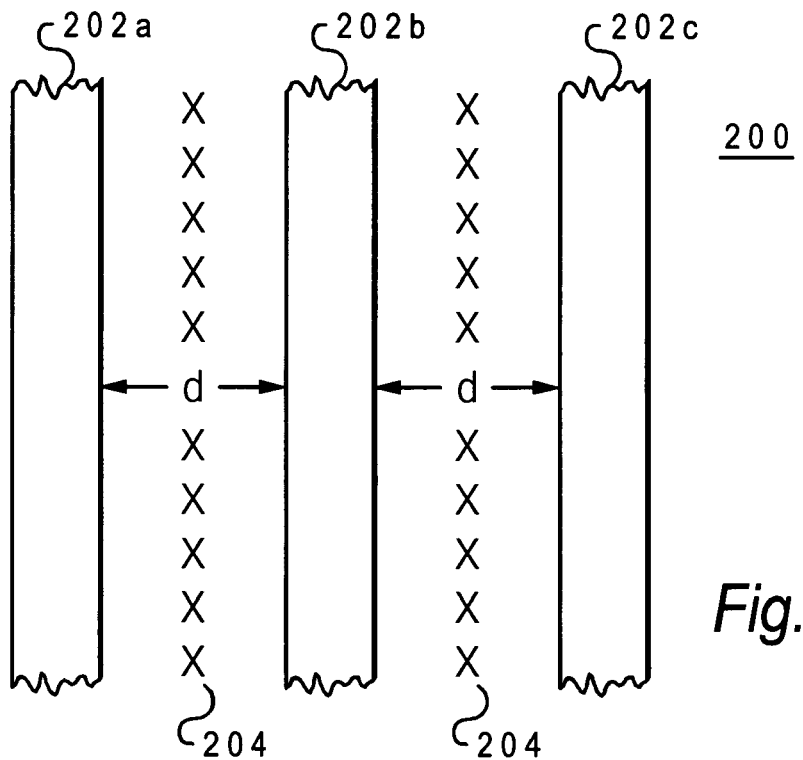
FIG. 2A is a diagram illustrating a symmetrically isolated wire configuration in which a preferred embodiment of the present invention may be implemented.

Symmetrically-Isolated Wire Configuration:

FIG. 2A illustrates a symmetrically isolated wire configuration according to a preferred embodiment of the present invention. Any interconnect between two circuit elements on a substrate in an integrated circuit design is hereinafter referred to as a "wire". As depicted, wire 202b is symmetrically isolated from wires 202a and 202c. Space 204 represents a gap between networks on integrated circuit design 300 (as referenced in FIG. 3) and are normally filled with a dielectric such as silicon dioxide. The width of space 204 is at least a minimum distance d where capacitive coupling between wires 202a, 202b, and 202c generates crosstalk and noise that are below the noise threshold of the particular integrated circuit design. The method disclosed in the present invention recognizes that a symmetrically-isolated wire configuration is preferably utilized to isolate any identified problem networks. As depicted, the symmetrically-isolated wire configuration isolates the problem network by requiring that any neighboring wires or circuit elements be placed at least a minimum distance d away from the problem network (wire 202b). However, as discussed later in more detail in conjunction with FIG. 4, circuit and interconnect spacing may be limited during redesign. Therefore, an asymmetrically-isolated wire configuration, which isolates only one side of the identified problem network, may be preferable. Also, it should be understood that the symmetrically-isolated wire configuration may be implemented for only a portion of the identified problem net.

Figure 2B:
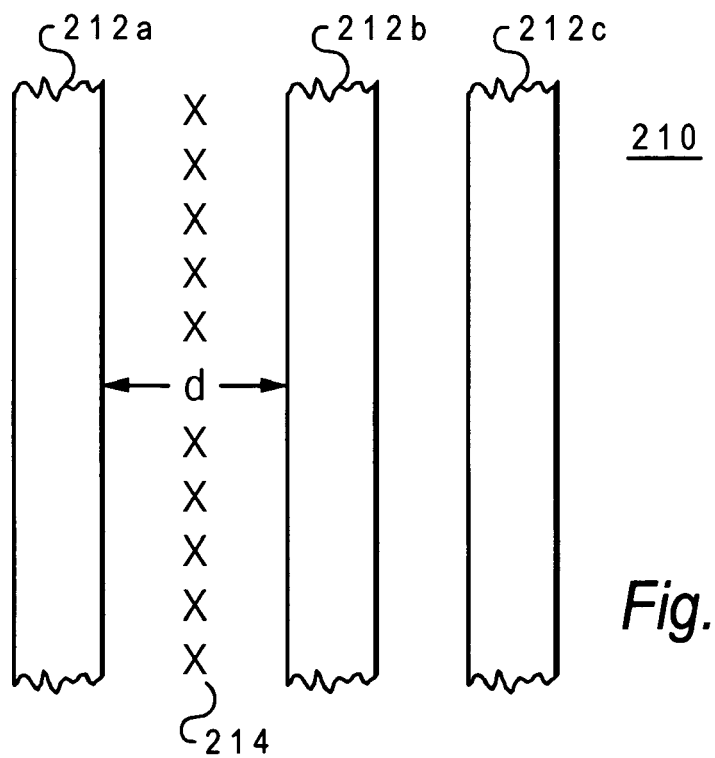
FIG. 2B is a diagram depicting an asymmetrically isolated wire configuration in which a preferred embodiment of the present invention may be implemented.

Asymmetrically-Isolated Wire Configuration:

FIG. 2B illustrates an asymmetrically isolated wire configuration according to a preferred embodiment of the present invention. As depicted, wire 212b is asymmetrically isolated from wires 212a and 212c. Space 214 represents a gap between networks on integrated circuit design 300 (as referenced in FIG. 3) and are normally filled with a dielectric such as silicon dioxide. The width of space 204 is at least a minimum distance d where capacitive coupling between wires 212a and 212b generates crosstalk and noise that are below the noise threshold of a particular integrated circuit design. Also, it should be understood that the asymmetrically-isolated wire configuration may be implemented for only a portion of the identified problem net, as illustrated in FIG. 3B. Wire 304b is asymmetrically isolated by space 322, but the segment of wire 304b that is coupled to circuit 318 is not asymmetrically or symmetrically isolated.

Figure 3A:
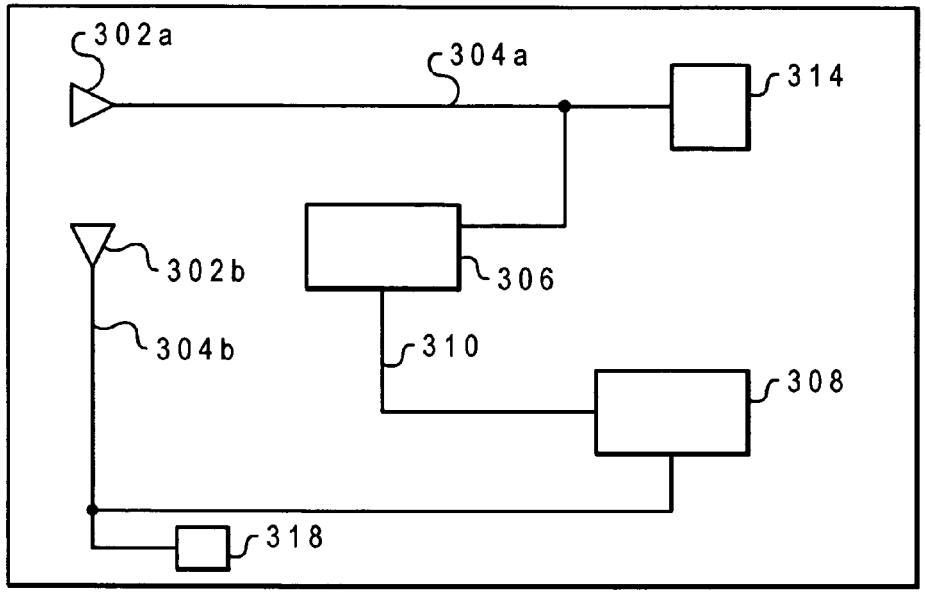
FIG. 3A is a block diagram depicting an integrated circuit in which a preferred embodiment of the present invention may be implemented.
Figure 3B:
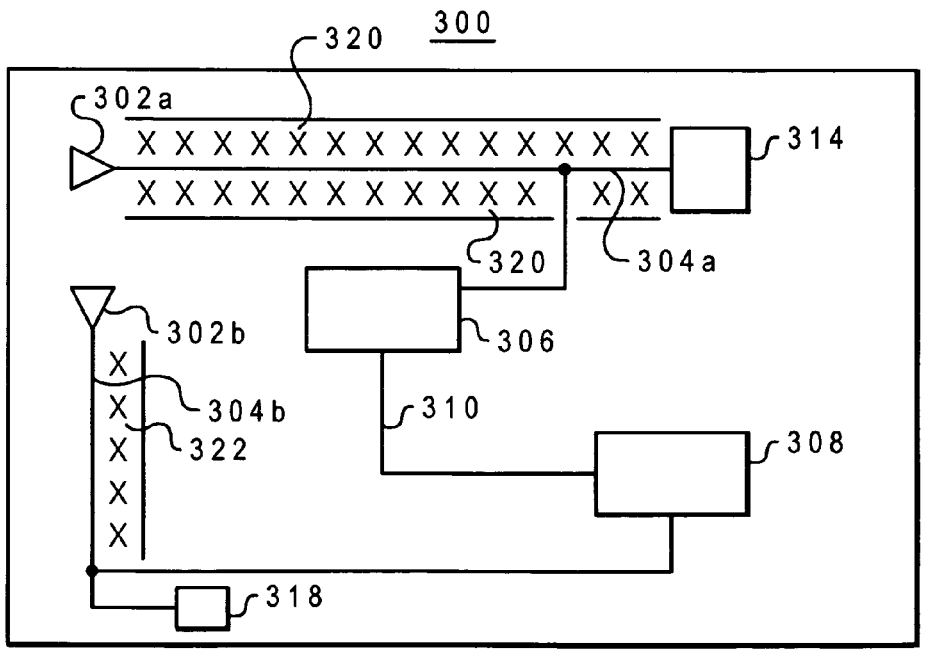
FIG. 3B is another block diagram depicting an integrated circuit in which a preferred embodiment of the present invention may be implemented.

Modification of Integrated Circuit Design:

Referring now to FIG. 3A, there is depicted a block diagram illustrating an integrated circuit design according to a preferred embodiment of the present invention. As illustrated, integrated circuit design 300 includes a collection of driver circuits 302a and 302b, a collection of wires 304a, 304b and 310, and a collection of circuits 306, 308, 314, and 318. The present invention discloses a method of identifying problem networks within integrated circuit design 300. Those with skill in this art will appreciate that the identification of problem networks before the modification of an integrated circuit design such an integrated circuit design 300, is valuable for later troubleshooting. As previously discussed, a "problem network" includes any wire and all associated branches on an integrated circuit design whose length cumulatively equals or exceeds WLEN, which is a predetermined threshold noisy wire length. For example, a threshold noisy wire length (WLEN) may be set at 1 mm, where any network that equals or exceeds 1 mm will be considered a problem network.

First, problem networks within integrated circuit design 300 are identified. The identification of problem networks may be performed by a user, a designer, or a computer program. After the problem networks are identified, the drivers coupled to the problem networks are replaced by drivers of a lower driving capacity. As illustrated in FIG. 3A, wires 304a and 304b may be considered problem networks. Drivers 302a and 302b may be considered drivers coupled to these problem networks. After drivers 302a and 302b are replaced with drivers of lesser driving capacity, the entire integrated circuit design 300 is retested. After the test of integrated circuit design 300, new timing problems, if any, are identified. If these timing problems reside on any of the identified problem networks, these problem networks are isolated utilizing configurations such as a symmetrically isolated wire configuration as depicted in FIG. 2A, or an asymmetrically isolated wire configuration as depicted in FIG. 2B.

With reference now to FIG. 3B, there is depicted an integrated circuit design 300 with asymmetrically isolated and symmetrically isolated wire configurations. As illustrated, wire 304a is symmetrically isolated. Space 320 on both sides of wire 304a indicate spaces where new wires or circuit elements may not be routed during the redesign. Wire 304b is asymmetrically isolated. Space 322 as indicated in FIG. 3B is an area where new wires and circuit elements may not be placed in the redesign. Now, after the identification of the problem networks and the placing of symmetrical and asymmetrical wire configurations, integrated circuit designers may proceed with the redesign. This redesign accounts for the fact that space 320 and 322 will not allow the routing of any new wires or circuit elements, thus preventing further crosstalk and noise problems within integrated circuit design 300.

Figure 4:
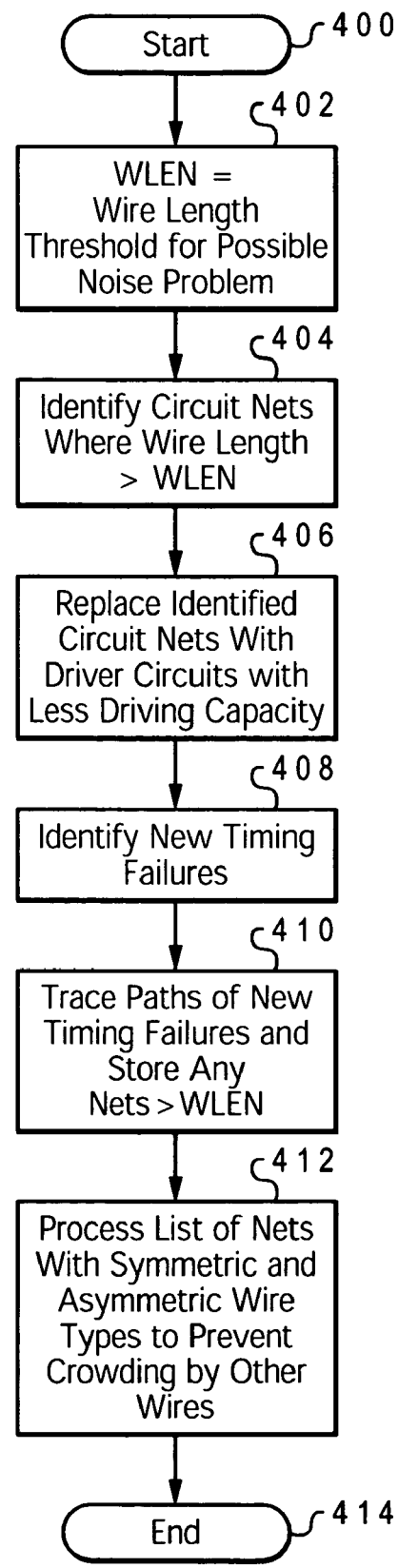
FIG. 4 is a high level flowchart diagram illustrating a method of modifying an integrated circuit design in which a preferred embodiment of the present invention may be implemented.

Referring now to FIG. 4, there is a more detailed high level logical flowchart illustrating steps 108-112 of FIG. 1. The process begins at step 400 and proceeds to Step 402, which illustrates a user defining "WLEN" as a threshold noisy wire length above which a possible noise problem may result. The value of WLEN varies depending on the particular integrated circuit design.

Then, the process continues to step 404, which illustrates the identification of circuit networks within integrated circuit design where the wire length equals or exceeds WLEN. This identification may be performed by a computer, which may calculate the length of each wire and all associated branches utilizing a software package that enables the computer to analyze integrated circuit designs, or by the user. The process then continues to step 406, which depicts the driver's circuit of the problem networks being replaced with driver circuits of less driving capacity. Those with skill in this art will appreciate the driver's circuit strength and a signal propagating through a wire. Because signal strength can be degraded due to noise and crosstalk, a driver's circuit may cancel out these affects. However, if the driver's circuit is a lesser driving capacity, the wire may be more susceptible to noise and crosstalk.

By replacing the driver's circuit along these problem networks with a driver circuit of lesser driving capacity, problem networks may be readily identified by the integrated circuit designer before the modification of integrated circuit design 300. While identifying these problem networks, the integrated circuit designer may isolate these problem networks from future modifications during the redesign of integrated circuit design 300.

The process then proceeds to step 408, which depicts the identification of new timing failures after the replacement step discussed in conjunction with step 406. The process proceeds to step 410, which illustrates a computer system tracing the source of the newly identified timing failures and storing the identity of any networks with a wire length equal or exceeding WLEN. These networks with a wire length equal or exceeding WLEN are considered problem networks. These problem networks will later be isolated using a symmetric or asymmetrically isolated wire configuration. The process then continues to step 412, which depicts a computer system replacing the problem networks with symmetric or asymmetric wire configurations (of the type discussed in conjunction with FIGS. 2A and 2B).

Specifically, the replacement of problem networks with symmetric and asymmetric wire configurations prevents routing of new integrated circuit features such as logic circuits or other wires within a specified distance of the problem network. For example, referring again to FIG. 2A and FIG. 3B, once the problem network has been replaced with a symmetrically isolated wire 202b, no new features may be placed within distance d of wire 202b. Referring to FIG. 3B, wire 304a is symmetrically isolated from the rest of integrated circuit design 300 by space 320. Accordingly, with reference to FIG. 2B and FIG. 3B, no new features may be placed within distance d on asymmetrically isolated wire 212b. In FIG. 3B, wire 304b is asymmetrically isolated with space 322. However, circuit elements and wires may be routed on the other side of the wire 304b. While a circuit designer preferably replaces all problem networks with a symmetric wire configuration, there are some instances when an asymmetric wire configuration may be needed. Some factors to consider include: circuit density and overall available space on an integrated circuit design. Finally, the process continues to step 414, which illustrates the process ending.

As disclosed, the present invention is a method of modifying an integrated circuit design. A threshold noisy wire length for a particular integrated circuit design is selected. An integrated design is examined for problem networks, or networks that cumulatively equal or exceed the designated threshold noisy wire length. Once the problem networks are identified, the driver circuits driving the problem networks are temporarily replaced with driver circuits with lesser driving capacity. The integrated circuit design is then tested and any new timing failures are identified. These new timing failures indicate problem networks that would probably be affected by the insertion of wires or circuit elements in a redesign of the integrated circuit design. Networks that include new timing failures are replaced with symmetric and/or asymmetric wire configurations to isolate these problem networks.

While this invention has been particularly shown as described with reference to a preferred embodiment, it will be understood by those skilled in this art, the various changes in form and detail may be made herein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal-bearing media utilized to actually carry out the distribution. Examples of such signal bearing media include, without limitation, recordable type media such as floppy disks or CD-ROMs and transmission type media such as analog or digital communication links.

While the invention has been particularly shown and described with reference to a preferred embodiment, it will be understood by those skilled in the art that various changes in form and detail may be made therein without departing from the spirit and scope of the invention.

The invention claimed is:

1. A method modifying an integrated circuit design, comprising:
   identifying at least one problem network within an integrated circuit design that equals or exceeds a threshold noisy wire length;
   temporarily replacing a first driver circuit coupled to said at least one problem network with a second driver circuit with lesser drive capacity;
   in response to said temporarily replacing said first driver, testing said integrated circuit design to identify at least one network that exceeds a noise threshold; and
   in response to identifying said at least one network, isolating, from future modification of said integrated circuit design, at least one portion of said at least one network, wherein said future modifications introduce noise problems that lead to timing problems within said integrated circuit design.

2. The method of claim 1, wherein said testing said integrated circuit design further comprises:
   identifying a new timing problem.

3. The method of claim 1, wherein said isolating further comprises:
   in response to identifying said at least one network, isolating, from future modification of said integrated circuit design, a first network in said at least one network with at least one symmetric wire configuration, wherein said future modifications introduce noise problems that lead to timing problems within said integrated circuit design.

4. The method of claim 1, wherein said isolating further comprises:
   in response to identifying said at least one network, isolating, from future modification of said integrated circuit design, a first network in said at least one network with at least one asymmetric wire configuration, wherein said future modifications introduce noise problems that lead to timing problems within said integrated circuit design.

5. The method of claim 1, wherein said isolating further comprises:

in response to identifying said at least one network, isolating, from future modification of said integrated circuit design, a second network in said at least one network with at least one symmetric wire configuration, wherein said future modifications introduce noise problems that least to timing problems within said integrated circuit design.

6. The method of claim 1, wherein said isolating further comprises:
in response to identifying said at least one network, isolating, from future modification of said integrated circuit design, a second network in said at least one network with at least one asymmetric wire configuration, wherein said future modifications introduce noise problems that least to timing problems within said integrated circuit design.

7. A computer-readable medium storing a computer program product comprising instructions for:
identifying at least one problem network within an integrated circuit design that equals or exceeds a threshold noisy wire length;
temporarily replacing a first driver circuit coupled to said at least one problem network with a second driver circuit with lesser drive capacity;
in response to said temporarily replacing said first driver, testing said integrated circuit design to identify at least one network that exceeds a noise threshold; and in response to identifying said at least one network, isolating, from future modification of said integrated circuit design, at least one portion of said at least one network, wherein said future modifications introduce noise problems that lead to timing problems within said integrated circuit design.

8. The computer-readable medium of claim 7, wherein said instructions for testing said integrated circuit design further comprises instructions for:
identifying a new timing problem.

9. The computer-readable medium of claim 7, wherein said instructions for isolating further comprises instructions for:
in response to identifying said at least one network, isolating, from future modification of said integrated circuit design, a first network in said at least one network with at least one symmetric wire configuration, wherein said future modifications introduce noise problems that lead to timing problems within said integrated circuit design.

10. The computer-readable medium of claim 7, wherein said instructions for isolating further comprises instructions for:
in response to identifying said at least one network, isolating, from future modification of said integrated circuit design, a first network in said at least one network with at least one asymmetric wire configuration, wherein said future modifications introduce noise problems that lead to timing problems within said integrated circuit design.

11. The computer-readable medium of claim 7, wherein said instructions for isolating further comprises instructions for:
in response to identifying said at least one network, isolating, from future modification of said integrated circuit design, a second network in said at least one network with at least one symmetric wire configuration, wherein said future modifications introduce noise problems that least to timing problems within said integrated circuit design.

12. The compute-readable medium of claim 7, wherein said instructions for isolating further comprises instructions for: in response to identifying said at least one network, isolating, from future modification of said integrated circuit design, a second network in said at least one network with at least one asymmetric wire configuration, wherein said future modifications introduce noise problems that least to timing problems within said integrated circuit design.

* * * * *